US012592363B2

(12) United States Patent
Cong et al.

(10) Patent No.: US 12,592,363 B2
(45) Date of Patent: Mar. 31, 2026

(54) ACTIVELY CONTROLLED GAS INJECT FOR PROCESS TEMPERATURE CONTROL

(71) Applicant: Applied Materials, Inc., Santa Clara, CA (US)

(72) Inventors: Zhepeng Cong, San Jose, CA (US); Ashur J. Atanos, San Jose, CA (US); Nimrod Smith, Cupertino, CA (US); Khokan C. Paul, Cupertino, CA (US); Tao Sheng, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 437 days.

(21) Appl. No.: 18/361,267

(22) Filed: Jul. 28, 2023

(65) Prior Publication Data

US 2025/0037975 A1 Jan. 30, 2025

(51) Int. Cl.
*H01J 37/32* (2006.01)
*H01L 21/67* (2006.01)

(52) U.S. Cl.
CPC ...... *H01J 37/32449* (2013.01); *H01J 37/321* (2013.01); *H01J 37/32522* (2013.01); *H01L 21/67017* (2013.01); *H01L 21/67098* (2013.01)

(58) Field of Classification Search
CPC .............. H01J 37/32449; H01J 37/321; H01J 37/32522; H01J 37/3244; H01L 21/67017; H01L 21/67098; H01L 21/67103; H01L 21/67109; H01L 21/67115; C23C 16/45561; H05B 6/02; H05B 6/10; H05B 6/36
USPC ........ 118/715; 156/345.33, 345.34; 219/600, 219/635, 636, 637
See application file for complete search history.

(56) References Cited

U.S. PATENT DOCUMENTS

| | | | |
|---|---|---|---|
| 10,047,457 B2 | 8/2018 | Shah et al. | |
| 10,975,495 B2 | 4/2021 | Komori | |
| 2013/0133579 A1* | 5/2013 | Fang .................. | C23C 16/4557 118/724 |
| 2020/0199748 A1 | 6/2020 | Pandey et al. | |

(Continued)

FOREIGN PATENT DOCUMENTS

| | | |
|---|---|---|
| CN | 107403717 B | 7/2023 |
| KR | 10-2008-0008933 A | 1/2008 |

OTHER PUBLICATIONS

International Search Report and Written Opinion dated Jul. 22, 2024 for Application No. PCT/US2024/022805.

*Primary Examiner* — Rudy Zervigon
(74) *Attorney, Agent, or Firm* — Patterson + Sheridan, LLP

(57) ABSTRACT

A flow apparatus and process chamber having the same are described herein. In one example, flow apparatus for use in semiconductor processing comprises an inject assembly and an inductive heater coupled to the inject assembly. The inject assembly comprises an inject body, a first gas inlet configured to flow a first gas through the inject body, and a plurality of flow channels disposed in the inject body, the plurality of flow channels coupled to the first gas inlet. The inductive heater is configured to heat a gas and comprises a heater housing, a graphite rod disposed in the heater housing, the graphite rod having a distal end and proximate end, an inductive coil disposed around the graphite rod, and a second gas inlet configured to flow a second gas between the heater housing and a graphite rod.

20 Claims, 4 Drawing Sheets

(56) References Cited

U.S. PATENT DOCUMENTS

2020/0332437  A1     10/2020  Burrows et al.
2022/0254634  A1      8/2022  Burrows et al.

* cited by examiner

ACTIVELY CONTROLLED GAS INJECT FOR PROCESS TEMPERATURE CONTROL

BACKGROUND

Field

Embodiments of the present disclosure generally relate to an apparatus for processing a substrate. More specifically, the embodiments described herein relate to an apparatus for heating gasses provided to a semiconductor processing chamber.

Description of the Related Art

Semiconductor substrates are processed for a wide variety of applications, including the fabrication of integrated devices and micro-devices. One method of substrate processing includes depositing a material, such as a dielectric material or a conductive metal, on an upper surface of the substrate in a processing chamber. For example, epitaxy is a deposition process that grows a thin, ultra-pure layer, usually of silicon or germanium on a surface of a substrate. The material may be deposited in a lateral flow chamber by flowing a process gas parallel to the surface of a substrate positioned on a support and thermally decomposing the process gas to deposit a material from the process gas onto the substrate surface. Increased density and complexity of next generation devices necessitate lower thermal budgets during processing. Low temperature processing has presented challenges to processing a substrate with the same reaction rates as exhibited in processing at higher temperatures.

Therefore, there is a need for improved reaction rates within a processing chamber.

SUMMARY

A flow apparatus and process chamber having the same are described herein. In one example, flow apparatus for use in semiconductor processing comprises an inject assembly and an inductive heater coupled to the inject assembly. The inject assembly comprises an inject body, a first gas inlet configured to flow a first gas through the inject body, and a plurality of flow channels disposed in the inject body, the plurality of flow channels coupled to the first gas inlet. The inductive heater is configured to heat a gas and comprises a heater housing, a graphite rod disposed in the heater housing, the graphite rod having a distal end and proximate end, an inductive coil disposed around the graphite rod, and a second gas inlet configured to flow a second gas between the heater housing and a graphite rod. The second gas inlet is disposed at the distal end and is fluidly connected to the plurality of flow channels of the inject assembly.

In another example, a processing chamber flow apparatus for use in semiconductor processing comprises an inject assembly and an inductive heater coupled to the inject assembly. The inject assembly comprises an inject body, a first gas inlet configured to flow a first gas through the inject body, a plurality of flow channels disposed in the inject body, the plurality of flow channels coupled to the first gas inlet, and an inject casing surrounding the inject assembly. The inductive heater is configured to heat a gas and comprises a heater housing, a graphite rod disposed in the heater housing, the graphite rod having a distal end and proximate end, an inductive coil disposed around the graphite rod, and a second gas inlet configured to flow a second gas between the heater housing and a silicon carbide coated graphite rod, the second gas inlet disposed at the distal end and fluidly connected to the plurality of flow channels of the inject assembly.

In another example, a processing chamber comprises a process chamber having a chamber volume therein, a substrate support, a pre-heat ring disposed in the chamber volume, the substrate support surrounding the pre-heat ring an inject assembly, and inductive heater coupled to the inject assembly. The inject assembly comprises an inject body, a first gas inlet configured to flow a first gas through the inject body, and a plurality of flow channels disposed in the inject body, the plurality of flow channels coupled to the first gas inlet. The inductive heater is configured to heat a gas and comprises a heater housing, a graphite rod disposed in the heater housing, the graphite rod having a distal end and proximate end, an inductive coil disposed around the graphite rod, and a second gas inlet configured to flow a second gas between the heater housing and a graphite rod. The second gas inlet is disposed at the distal end and is fluidly connected to the plurality of flow channels of the inject assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
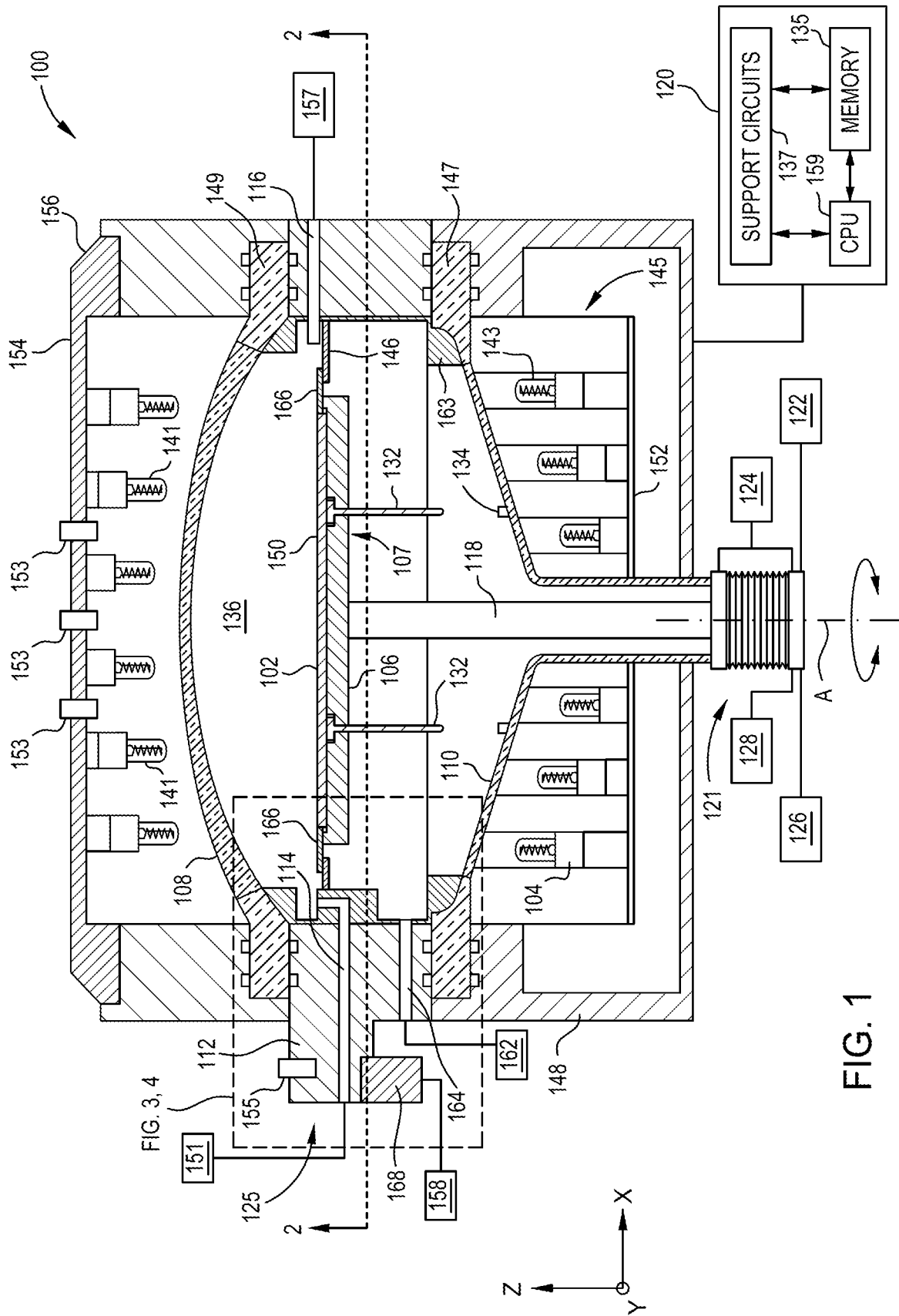
FIG. 1 is a schematic cross-sectional side view of a process chamber, according to embodiments of the present disclosure.

A heated gas injection assembly for heating a gas provided to a semiconductor processing chamber, and processing chamber having the same are described herein. The heated gas injection assembly can beneficially be used in a deposition chamber, such as an epitaxial deposition chamber. A heater is configured to provide temperature control to the gas injection assembly external to the deposition chamber processing volume and therefore enable increased gas/precursor activation energy prior to entry in the processing volume.

It has been found that precursors and/or process gases react with the surface of the substrate to form a film. The rate of reaction to form the film increases with an increase in the temperature of the precursor and/or process gas. This increase in temperature is known to raise the activation energy of the gases thereby enabling the excited gases to achieve the increased rate of the reaction. The precursors and process gases are often heated as the precursors and/or process gases pass over the substrate. Higher temperature tolerant substrates often produce higher growth rates and therefore higher substrate throughputs. However, the material composition and structures formed on the substrate sometimes limit the maximum temperature which is applied to the substrate before causing damage or warpage to the substrate. The temperature of the substrate is a major factor in the process characteristics, such as the precursor selection, throughput, growth rate, and growth uniformity. Therefore, as substrate temperature limits have tended to decrease, methods to increase activation energy of deposition gases are contemplated to achieve the reaction rates as those compared to higher temperature deposition processes. The use of a heater assists in increasing the temperature of the precursors/process gases before the precursors/process gases are flowed over the substrate. However, an increase in activation energy of the gases may be time dependent as excited gases return to their normal state once the activation energy lowers. Providing heated precursors/process gases to the chamber encourages higher reaction rates. However, preheating the gas too early allows the activation energy to dissipate prior to film deposition within the chamber processing volume.

Heating a non-reactive gas (i.e., a carrier gas, such as an inert gas) provides a heating medium that may be mixed with the precursors/process gases prior to the gas mixture entry into the processing volume for deposition. Furthermore, resonance time, gas flowrates, and location of the mixing are contemplated variables for adjustments of the activation energy of the gases. Therefore, the time dependency of the activation energy of the precursors/process gases may be adjusted by strategically heating the carrier gas and mixing the heated carrier gas with the precursors/process gases.

A sensor, such as a pyrometer or other temperature sensor, may be mounted adjacent to one of the heater to measure the temperature of the heater or the gas being heated. Measuring the temperature of the heater or the gas being heated enables the temperature control of the heater to be monitored in real time and enables adjustment of the heater power to adjust epitaxial growth rates on the substrate. Monitoring the temperature of the heater (or gas) further enables more repeatable process results as the power applied to the one or more heaters may be adjusted.

FIG. 1 is a schematic cross-sectional side view of a process chamber 100, such as a deposition chamber, such as an epitaxial deposition chamber. In one example, the process chamber 100 is utilized to grow an epitaxial film on a substrate 102. The process chamber 100 is configured to create a cross-flow of precursors across a top surface 150 of the substrate 102.

The process chamber 100 includes an upper body 156, a lower body 148 disposed below the upper body 156, a flow module 112 disposed between the upper body 156 and the lower body 148. The upper body 156, the flow module 112, and the lower body 148 form a chamber body. Disposed within the chamber body is a substrate support 106, an upper transmissive window 108, a lower transmissive window 110, a plurality of upper lamps 141, and a plurality of lower lamps 143. As shown, the controller 120 is in communication with the process chamber 100 and is used to control processes, such as those described herein. The substrate support 106 is disposed between the upper transmissive window 108 and the lower transmissive window 110. The plurality of upper lamps 141 are disposed between the upper transmissive window 108 and a lid 154. The lid 154 includes a plurality of sensors 153 disposed therein for measuring the temperature within the process chamber 100. The plurality of lower lamps 143 are disposed between the lower transmissive window 110 and a floor 152. The plurality of lower lamps 143 form a lower lamp assembly 145.

A process volume 136 is formed between the upper transmissive window 108 and the lower transmissive window 110. The upper transmissive window 108 may have a dome shape or be substantially flat. The upper transmissive window 108 is supported by a support ring 149. The support ring is coupled to an outer edge of the upper transmissive window 108 and is disposed between the upper body 156 and the flow module 112. The lower transmissive window 110 may also be a dome shape or be substantially flat. The lower transmissive window 110 has an opening in the center for a shaft 118 of the substrate support 106 to be disposed there through. The lower transmissive window 110 is supported at an outer edge by a lower support ring 147. The support ring is disposed between the lower body 148 and the flow module 112.

The process volume 136 has the substrate support 106 disposed therein. The substrate support 106 includes a top surface 150 on which the substrate 102 is disposed. The substrate support 106 is attached to the shaft 118. The shaft is connected to a motion assembly 121. The motion assembly 121 includes one or more actuators and/or adjustment devices that provide movement and/or adjustment of the shaft 118 and/or the substrate support 106 within the process volume 136. The motion assembly 121 includes a rotary actuator 122 that rotates the shaft 118 and/or the substrate support 106 about a longitudinal axis A (e.g., vertical z-axis) of the process chamber 100. In one example, the motion assembly 121 further includes a vertical actuator 124 to lift and lower the substrate support 106 in the z-direction. The motion assembly includes a tilt adjustment device 126 that is used to adjust the planar orientation of the substrate support 106, relative to the axis A, and a lateral adjustment device 128 that is used to adjust the position of the shaft 118 and the substrate support 106 side to side (i.e., in the x/y plane) within the process volume 136.

The substrate support 106 may include lift pin holes 107 disposed therein. The lift pin holes 107 are sized to accommodate a lift pin 132 for lifting of the substrate 102 from the substrate support 106 either before or after a deposition process is performed. The lift pins 132 may rest on lift pin stops 134 when the substrate support 106 is lowered from a processing position to a transfer position.

The pre-heat ring 166 has a ring shape and is disposed around an outer edge of the substrate 102. The pre-heat ring 166 may overlap an outermost portion of the substrate support 106 and rests on the substrate support 106 surrounding the substrate 102. The pre-heat ring 166 may be formed of one or more parts. The pre-heat ring 166 has a top surface which is parallel to the direction of gas flow across the top surface 150 of the substrate 102 and the substrate support 106.

In one or more embodiments, the flow module 112 includes a plurality of process gas inlets 114, a plurality of purge gas inlets 164, and one or more exhaust gas outlets 116. The flow module 112 also includes an opening that receives an inject assembly, later discussed in FIG. 2, that houses the temperature sensor 155 shown. The plurality of process gas inlets 114 and the plurality of purge gas inlets 164 are disposed on the opposite side of the flow module 112 from the one or more exhaust gas outlets 116. In one or more embodiments, the shield 146 is disposed below the plurality of process gas inlets 114 and the one or more exhaust gas outlets 116. The shield 146 is disposed above the purge gas inlets 164. Furthermore, the shield 146 is configured guide gas flows on both its upper surface and lower surface in a substantially lateral direction. A liner 163 is disposed on the inner surface of the flow module 112 and protects the flow module 112 from reactive gases used during deposition processes. The process gas inlets 114 and the purge gas inlets 164 are positioned to flow gas parallel to the top surface 150 of a substrate 102 disposed within the process volume 136. The process gas inlets 114 are fluidly connected to a process gas source 151 and a carrier gas source 158 thorough a flow path within the one or more heaters 168. The purge gas inlets 164 are fluidly connected to a purge gas source 162. The one or more exhaust gas outlets 116 are fluidly connected to an exhaust pump 157. Each of the process gas source 151 and the purge gas source 162 may be configured to supply one or more precursors or process gases and/or purge gases into the process volume 136. Similarly, the carrier gas source 158 may be configured to supply one or more inert gases (i.e., carrier gases) into the process volume 136. In some embodiments, the process gas source 151 may provide a cleaning gas to the flow module for cleaning chamber components, including components within the flow module 112.

In one or more embodiments, the one or more heaters 168 are disposed below a distal end 125 of the flow module 112 and external to the process chamber 100. The external one or more heaters 168 allows for greater accessibility for maintenance and further prevents corrosion prone to affect heaters disposed within the process chamber 100 resulting in less production losses. In one or more embodiments, an inert gas from the carrier gas source 158 is heated through the one or more heaters 168 and mixed with the one or more precursors or process gases flowed within the process gas inlets 114 thereby heating the one or more precursors or process gases to raise the activation energy of the one or more precursors or process gases to decrease deposition defects and increase productivity for low temperature substrate processes. In one or more embodiments, a controller 120 is programed to initiate heating components, such as the one or more heater 168, to heat the one or more precursors or process gases.

The controller 120 includes a central processing unit (CPU) 159 (e.g., a processor), a memory 135 containing instructions, and support circuits 137 for the CPU 159. The controller 120 controls various items directly, or via other computers and/or controllers. In one or more embodiments, the controller 120 is communicatively coupled to dedicated controllers, and the controller 120 functions as a central controller.

Figure 2:
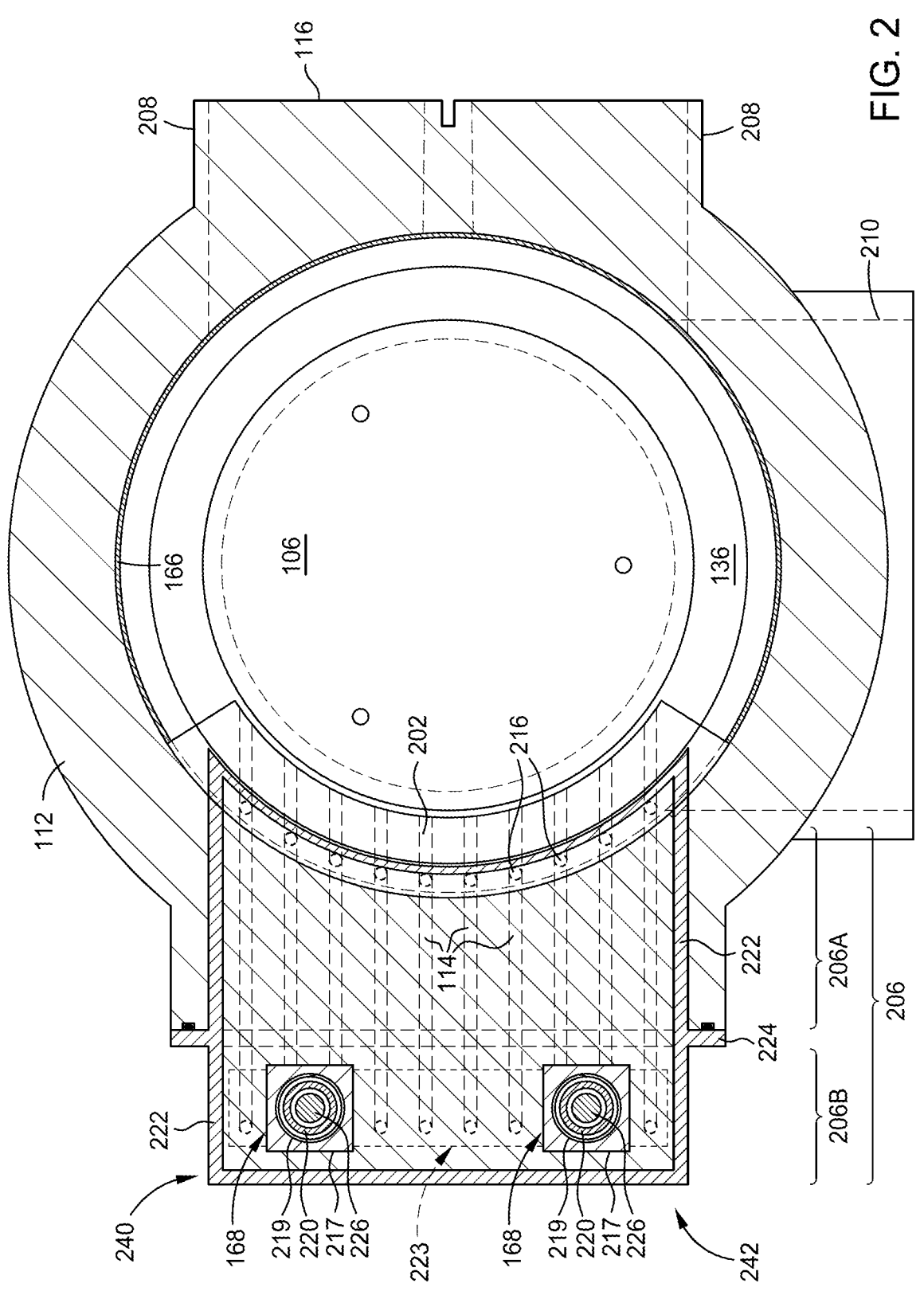
FIG. 2 is a schematic cross-sectional view of the process chamber through a first plane, according to embodiments of the present disclosure.

FIG. 2 is a schematic cross-sectional view of the process chamber section line 2-2 depicted in FIG. 1. The sectional view of FIG. 2 passes through the heaters 168 and the flow module 112, and beneath the substrate support 106 and the pre-heat ring 166. As shown in FIG. 2, an inject assembly 206 is disposed on a first side of the flow module 112. The inject assembly 206 may be either contiguous within or separable from the flow module 112. In one or more embodiments, the inject assembly 206 is encapsulated by the inject casing 222. In this embodiment, the inject casing is removal from an opening within flow module 112. Across from the inject assembly 206 on an opposite side of the flow module 112 is an exhaust assembly 208 which includes the exhaust gas outlets 116 disposed therethrough. A substrate transfer opening 210 is further disposed through a sidewall of the flow module 112. The substrate transfer opening 210 is sized to enable a substrate to pass therethrough. The substrate transfer opening 210 is between the inject assembly 206 and the exhaust assembly 208

The inject assembly 206 is a horizontal gas flow injector which directs gas over and parallel to a top surface 150 of the substrate 102. The inject assembly 206 has an inner portion 206A and an outer portion 206B. The inner portion 206A is disposed within the opening of the flow module 112. The outer portion 206B is disposed external to the flow module 112, thereby disposed external to the process chamber 100. In some embodiments, the inner most portion of the inner portion 206A may be an arcuate shape that follows the structure of the arcuate shape of the substrate support 106. In other embodiments, the inner most portion of the inner portion 206A may be a substantially flat.

The plurality of process gas inlets 114 are disposed through the inject assembly 206 and configured to provide a distributed gas flow horizontally over the substrate support 106. As such, the gases within the plurality of process gas inlets 114 enter nearest the outer portion 206B, flow through the inner portion 206A, and enter the process volume 136 through the angled portion 216 of the plurality of process gas inlets 114 and the gas channel outlet 202. The plurality of process gas inlets 114 are further disposed within the inject casing 222 which surrounds the inject assembly 206. A casing flange 224 is coupled to an outside surface of the inject casing 222 and an exterior surface of the flow module 112 of the process chamber 100. Both the inject casing 222 and the casing flange 224 are constructed from quartz for chamber material compatibility. While not shown, the inject casing 222 may be covered by a protective shield to protect personnel from contacting hot surfaces. The casing flange 224 is utilized to secure the inject assembly 206 on the outside of the flow module 112 and holds the inserted inject assembly 206 in place. The casing flange 224 extends outward from the outside surfaces of the inject casing 222. In some embodiments, the casing flange 224 may be a unitary flange across all sides of the inject assembly 206 providing a seal against any chamber leaks. In some embodiments, the casing flange 224 merely provides a manner to couple the inject assembly 206 to the flow module 112.

In the embodiment of FIG. 2, there are two heaters 168 shown on the outer portion 206B, however in some embodiments one or more heaters 168 may be used. The two heaters 168 are disposed on opposite sides of the inject assembly 206, such that a first heater 168 is disposed on a first side 240 of the inject assembly 206 and a second heater 168 is disposed on a second side 242 of the inject assembly 206. The first heater 168 and the second heater 168 are further disposed on opposite ends of the angled portion 216 of the plurality of process gas inlets 114. In some embodiments, additional heaters 168 may be disposed between the first heater 168 and the second heater 168.

Each of the one or more heaters 168 includes a heater core 226 disposed within a heater tube 220. The heater tube 220 is surrounded by a heater coil 219 winding. A heater housing 217 surrounds the heater core 226, the heater tube 220, and the heater coil 219. In one or more embodiments, the heater 168 is disposed under a window 223. The window 223 may be transparent, e.g., transparent to a sensor wavelength. In some embodiments, an optically transparent material containing a low hydroxyl concentration quartz allows the temperature sensor 155 of FIG. 1, to measure the temperature of the gases within the plurality of process gas inlets 114 or the outer portion 206B or the temperature of the heater core 226. In contrast, for example, high hydroxyl concentration quartz reduces infrared radiation (IR) detection by absorbing the IR. Thus, low hydroxyl concentrations of the window 223 enable sensors to accurately and efficiently measure through the window 223 using specific sensor wavelengths. The window 223 may be an elongated window spanning the length of the inject assembly. In some embodiments, the window 223 may be a circular window disposed over the heater 168. In some embodiments the inject assembly may contain one or more windows 223 over the one or more heaters 168.

Figure 3:
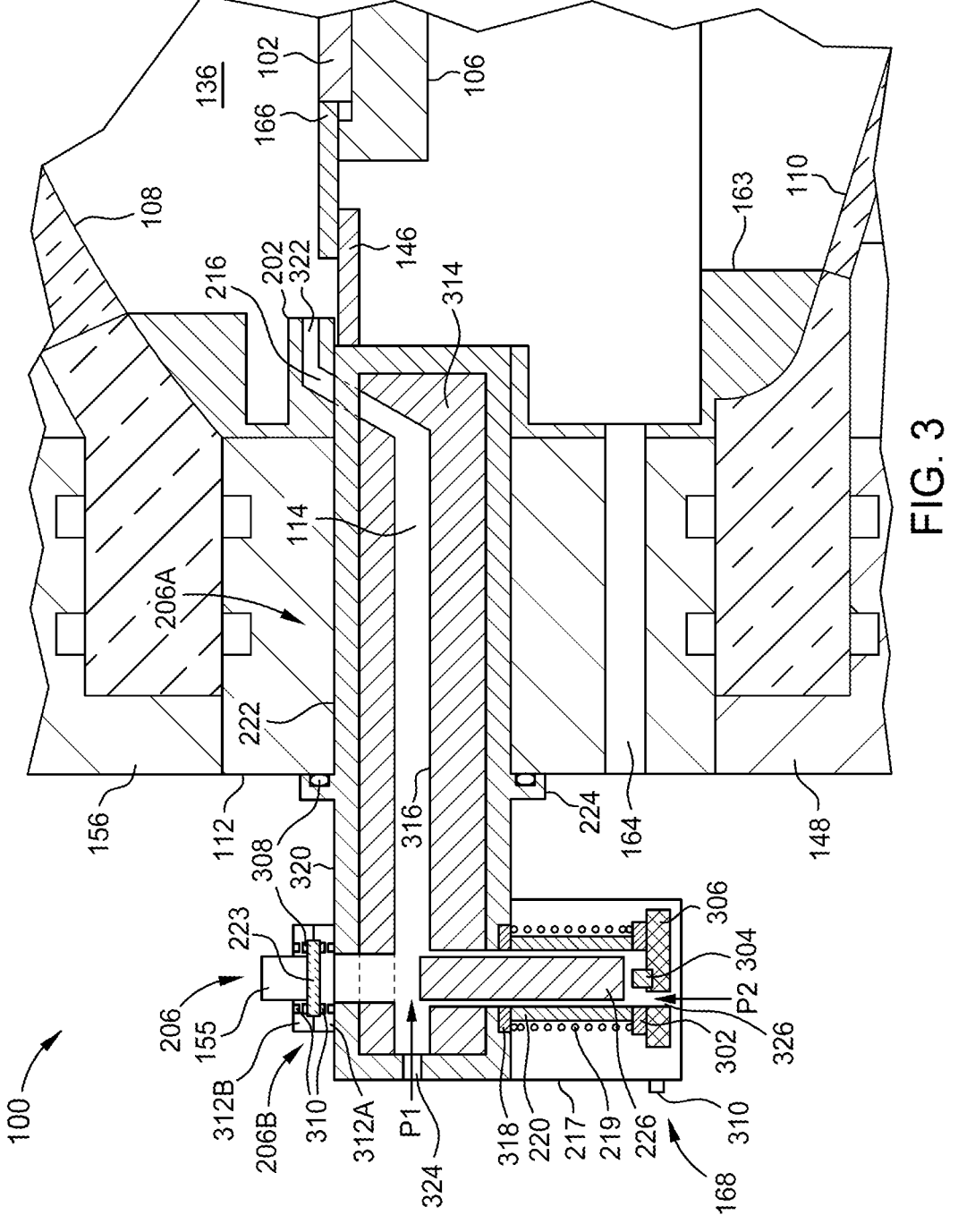
FIG. 3 is a schematic partial cross-sectional view of an inject assembly of the process chamber of FIG. 1, according to embodiments of the present disclosure.

FIG. 3 is a more detailed schematic partial cross-sectional view of inject assembly 206 of FIG. 2. The inject assembly 206 includes the one or more heaters 168, inject casing 222, casing flange 224, an inject body 314, the plurality of process gas inlets 114 with the angled portion 216, an inject cap 312, and the window 223.

Each of the one or more heaters 168 comprises a heater core 226, a heater tube 220, a heater coil 219, one or more seals 302, a spacer 304, an end plate 306, and heater housing 217. The heater core 226 may be a graphite rod. In some embodiments, the heater core 226 is a graphite rod with a silicon carbide (SiC) coating. The silicon carbide coating increases corrosion resistance properties and enables the heater core 226 to last longer. Alternatively, the heater core 226 may be constructed of other materials suitable to tolerate multiple heat cycles. The heater core 226 is a cylinder shaped component disposed within the heater 168 and partially in the inject body 314 of the inject assembly 206. The inject body 314 may be constructed from graphite. The heater core 226 may extend partially or fully into the plurality of process gas inlets 114. For example, in some embodiments, the gases flowing through the plurality of process gas inlets 114 may flow around and over a top surface of the heater core 226. In some embodiments, the heater core 226 is configured to direct gases around the circumference of the heater core 226 and between an innermost surface 316 of the plurality of process gas inlets 114.

The heater core 226 is disposed within the heater tube 220. The heater core 226 has an outer diameter smaller than the inner diameter of the heater tube 220 such that an unfilled space exists between the heater core 226 and the heater tube 220. The heater tube 220 provides thermal protection to the heater core 226. Direct heat from the heater coils 219 may damage the materials or the coating of the heater core 226. Sheltering the heater core 226 from the heater coils 219 by the heater tube 220 allows the heater 168 to increase heater life. The heater tube 220 may be constructed from quartz. Similarly, the heater core 226 has a spacer 304 on a bottom surface constructed from quartz. The spacer 304 is positioned to provide a space between the heater core 226 and an end plate 306. The heater tube 220 has an outer surface wrapped by a heater coil 219. The heater coil 219 is coupled to a radio frequency (RF) power. The heater coil 219 inductively heats the heater core 226 through the heater tube 220. The heater tube 220 abuts a lower seal 302 on a bottom end and an upper seal 318 on a top end adjacent to the heater casing 222. The heater coils 219 abut the lower seal 302 on a bottom end and the upper seal 318 on a top end adjacent to the heater casing 222. The seals 302, 318 may have a ring shape and physically contact the heater tube 220 and the heater coils 219. The seals 302, 318 are high temperature seals capable of withstanding elevated temperatures of about 1200 degrees Celsius. An end plate 306 is coupled to seal 302. The end plate 306 is a retaining plate configured to secure the inner components of the heater 168 within the heater housing 217. The end plate 306 is constructed of stainless steel. Stainless steel withstands temperatures achieved by the heater coil 219. Stainless steel is a strong metal that tolerates a compression force exerted onto seals 302, 318.

The heater housing 217 contains the internal components of the heater 168 within. The heater housing may include cooling operations (not shown) to adjust the temperature of the internal components of the heater 168. For example, in some embodiments, cooling is provided to keep the heater coils from becoming undesirably hot. In some embodiments, the heater coils are cooled using a cooling fluid comprising water. However, other cooling fluids capable of providing adequate cooling are contemplated. The heater housing 217 has a cooling connection 310 disposed on an outer surface and is configured to supply the cooling fluid to circulate within the heater housing 217.

The inject cap 312 is disposed on an upper surface of the inject casing 222 and aligned over the heater core 226 of the heater 168. As illustrated, the inject cap 312 is positioned to enable temperature sensor 155 to measure the temperature of the plurality of process gas inlets 114 or of the heater core 226. In some embodiments, the inject cap 312 position may be disposed on a sidewall 320 of the inject assembly 206 so as to provide a line of sight for the temperature sensor 155 to measure the temperature of the plurality of process gas inlets 114 or of the heater core 226. The inject cap 312 comprises a lower portion 312A and an upper portion 312B that straddle the window 223. The lower portion 312A is configured to secure the inject cap 312 to the heater casing 222 and support the window 223. In some embodiments, the lower portion 312A has a ledge surface configured to align the window 223 into a desired position. The upper portion 312B secures the window 223 to the lower portion 312A. Both the lower and upper portions 312A, 312B engage gaskets 308 that provide a pressure tight seal against the window 223. In some embodiments, the lower and upper portions 312A, 312B contain cooling connections 310 configured to provide cooling fluid to the temperature sensor 155 support thereon.

The temperature sensor 155 may be a pyrometer, thermocouple (TC), or resistance temperature detector (RTD) sensor capable of measuring the temperature of the heater 168 or of the process chamber 100, and the temperature of the process chamber 100. In operation, the temperature sensor 155 used to provide closed loop temperature control of the heater 168. The temperature sensor 155 provides measured data to the system controller 120 of FIG. 1. The controller 120 may compare the data obtained from the sensor 155 to a desired set point. Based on the differential data, the controller may send appropriate instructions to begin and/or cease a sequence of operations to change process conditions such as, but not limited to, increasing or reducing power to heater 168, change the flowrates of gases, or a combination thereof, to provide a desired gas resonance time. After a predetermined amount of time, data may be measured and again compared to the set point to begin the process of obtaining the desired set point. Iterations of the closed loop control operation initiated by the measured data may be infinite until intervened by a stopping event, such as operator command, and/or a pre-determined number of cycles, and/or predetermined time.

In operation, a process/precursor gas entering the process volume 136 is heated to achieve the elevated activation energy that enables high reaction rates. The process/precursor gas is heated by mixing the process/precursor gas with a heated carrier gas to avoid overheating the process/ precursor gas directly. Furthermore, the resonance time of the process gas mixture is limited as unintentional deposition and film formation within the process gas inlets 114 may occur. For example, resonance time of the activated gas may be increased or decreased by adjusting gas flowrates and/or adjusting the power levels of the heater 168. For example, $H_2$ or $N_2$ carrier gas may be from 0.1 standard liters per minute (slm) to about 100 slm, such as about 1 slm to about 75 slm, such as about 3 slm to about 50 slm. In some embodiments, the process/precursor gas can be from about 0.1 standard cubic centimeter (sccm) to about 4000 sccm, such as about 1 sccm to about 3000 sccm, such as about 5 sccm to about 2000 sccm. In some embodiments, a radio frequency (RF) can be increased or decreased to the heater coil 219 to adjust the gas temperature. For example, but not limited to, the RF can be about 1 megahertz (MHz) to about 50 MHz, such as about 2 MHZ, such as about 13.56 MHz, such as about 27 MHz, such as about 40.7 MHz. Therefore, the use of the heater 168 and adjustment of flowrates enables the adjustment of the activation energy of the process gas mixture.

The carrier gas is heated by flowing the carrier gas within the space defined between the heater core 226 and the heater tube 220, represented by flow path P2. The carrier gas is heated to a desired temperature and enters the process gas inlet 114 area. The carrier gas is a non-reactive gas, such as an inert gas, such as hydrogen gas ($H_2$) and/or nitrogen gas ($N_2$). Process/precursor gases may be supplied into the process gas inlets 114 through heater casing 222 and the inject body 314, represented by flow path P1. Different process/precursor gases may require higher or lower heat energy to elevate their respective activation energy. For example, but not limited to, hydrochloric gas (HCl) gas may not be activated unless the gas temperature exceeds 650 degrees Celsius. In some embodiments, HCl is supplied to the flow path P2 to achieve the desired elevated temperatures/activation energy by direct heating from the heater 168. In comparison to HCl, chlorine gas ($Cl_2$) requires lower temperatures to achieve the desired activation energy. The process/precursor gas mixes with the heated carrier gas within the process gas inlet 114 area and further flows into the process volume 136 for deposition. Similarly, a cleaning gas, for example $Cl_2$, may be supplied to the flow path P2 to facilitate a cleaning operation of removing deposits within the heater 168, the process gas inlet 114, and the gas channel outlet 202.

The process gas inlets 114 include an angled portion 216 disposed through the inject body 314 of the inject assembly 206. In the embodiment of FIG. 1, the angled portion 216 is a vertical portion and extends normally compared to the top surface 150 of the substrate 102. In some embodiments, as represented in FIG. 3, the angled portion 216 gradually ramps toward a horizontal portion 322 that extends over the shield 146 creating a substantially parallel gas channel outlet 202 compared to the process gas inlets 114 within the inject body 314. A gas channel outlet 202, extended in a horizontal direction, directs the flow pattern in a lateral direction over the top surface 150 of the substrate 102 for improved deposition of film and reduced product waste.

Figure 4:
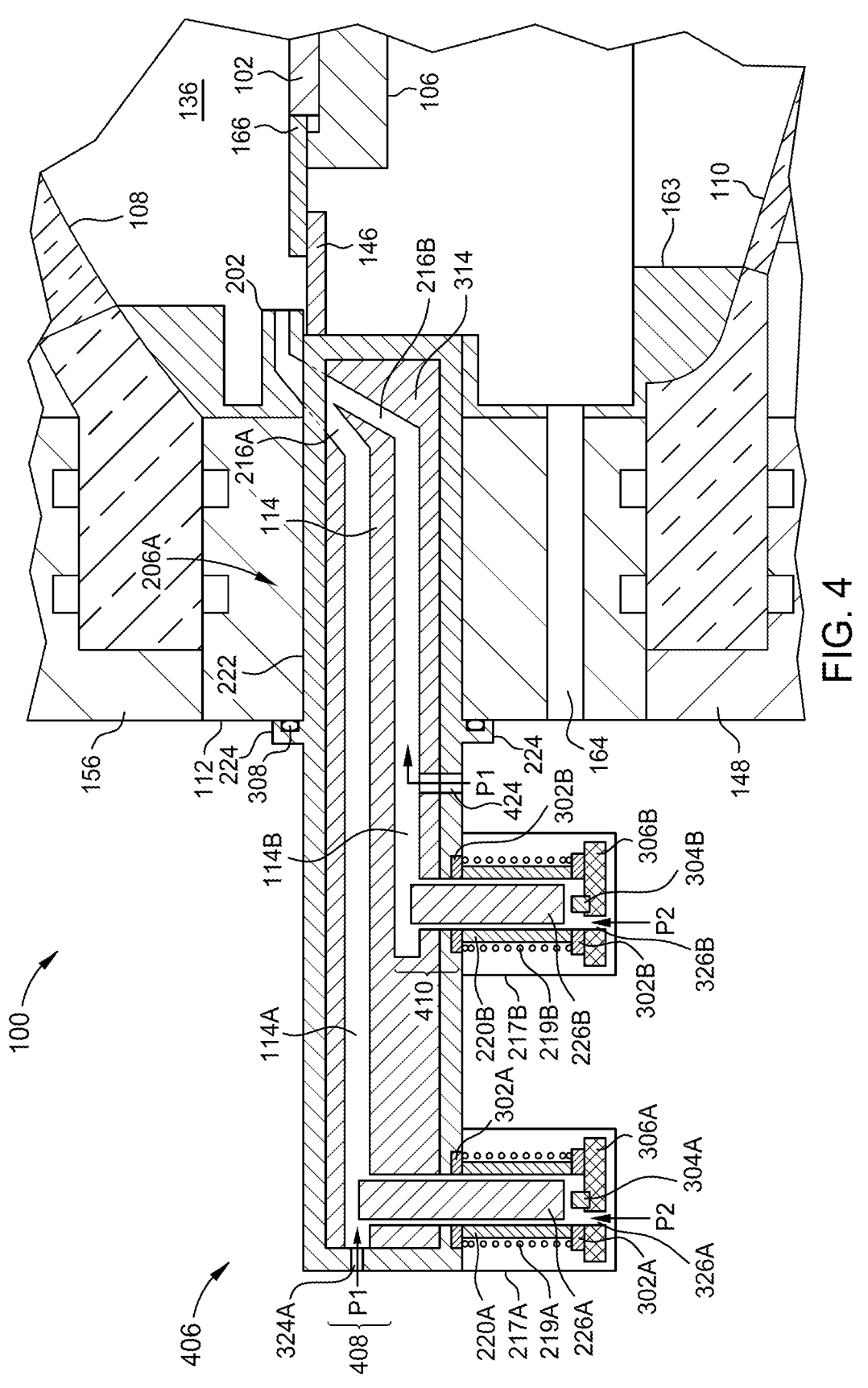
FIG. 4 is a schematic partial cross-sectional view of an inject assembly of the process chamber of FIG. 1, according to embodiments of the present disclosure.

The inject assembly 206 contains two gas entry sites 324, 326 into the process gas inlets 114. Gas entry site 324 is used for process/precursor gas. Gas entry site 326 is used for carrier gas. However, in some embodiments as illustrated in FIG. 4, the process/precursor gas may be configured to enter the process gas inlets 114 downstream of the heater 168 at gas entry site 424. For example, a heated carrier gas flowing through the process gas inlet 114 mixes with the process/ precursor gas supplied near the casing flange 224. The location of the entry sites can be used to increase or decrease the resonance time. In some embodiments multiple process/precursor gas entry sites are provided. For example, a process gas may be provided to flow path P1, a carrier gas may be provided to flow path P2, and a second process gas may be provided to an entry site downstream of the heater 168. Furthermore, it is contemplated that a mixing plenum (not shown) may be provided to mix the process/precursor gas and the carrier gas before traversing the process gas inlet 114 towards the process volume 136.

FIG. 4 is a schematic partial cross-sectional view of another embodiment of the inject assembly 206 of FIG. 3. FIG. 4 omits details of embodiments described in FIGS. 2 and 3. However, it is to be understood that the embodiments of FIGS. 2 and 3, may equally apply to the embodiments of FIG. 4.

The inject assembly 406 comprises a two level structure containing at least two process gas inlets, 114A and 114B. The inject assembly 406 comprises a first level 408 disposed above a second level 410. The first level 408 and the second level 410 are disposed partially in the inject body 314. The first level 408 and the second level 410 may be used for deposition operations, cleaning operations, or a combination thereon. For example, in some embodiments, the first level 408 may be used for a deposition operation while the second level 410 may be used for a cleaning operation. In another example, both levels 408 and 410 may be used for deposition. In another example, the gases supplied to each level are alternated wherein the first level 408 is used for deposition for a first operation, and the first level 408 is used for cleaning for a second operation.

While the foregoing is directed to embodiments of the present disclosure, other and further embodiments of the disclosure may be devised without departing from the basic scope thereof, and the scope thereof is determined by the claims that follow.

What is claimed is:

1. A process chamber flow apparatus for use in semiconductor processing comprising:
    an inject assembly comprising:
        an inject body;
        a first gas inlet configured to flow a first gas through the inject body;
        a plurality of flow channels disposed in the inject body, the plurality of flow channels coupled to the first gas inlet; and
    an inductive heater coupled to the inject assembly, the inductive heater configured to heat a gas, the inductive heater comprising:
        a heater housing;
        a graphite rod disposed in the heater housing, the graphite rod having a distal end and proximate end;
        an inductive coil disposed around the graphite rod; and
        a second gas inlet configured to flow a second gas between the heater housing and the graphite rod, the second gas inlet disposed at the distal end and fluidly connected to the plurality of flow channels of the inject assembly.

2. The apparatus of claim 1, wherein the inject body comprises a graphite material.

3. The apparatus of claim 1, wherein the inductive coil is coupled to a radio frequency (RF) power source.

4. The apparatus of claim 3, wherein the RF power source is configured to heat the graphite rod up to about 1200 degrees Celsius.

5. The apparatus of claim 1, wherein the graphite rod is coated with silicon carbide (SiC).

6. The apparatus of claim 1, wherein the heater housing includes cooling channels configured to flow heat transfer fluid therethrough.

7. The apparatus of claim 1, wherein the inject assembly further comprises an inject cap, the inject cap configured to support a transmissive window and a sensor.

8. The apparatus of claim 7, wherein the sensor is a pyrometer configured to measure a temperature of the graphite rod at the proximate end.

9. The apparatus of claim 7, further comprising a controller coupled to the sensor, the controller configured to adjust a radio frequency (RF) power source coupled to the inductive coil.

10. The apparatus of claim 1, wherein the inject assembly further comprises at least two plurality of flow channels stacked in a direction perpendicular to a direction of flow through the channels.

11. A process chamber flow apparatus for use in semiconductor processing comprising:

an inject assembly comprising:
  an inject body;
  a first gas inlet configured to flow a first gas through the inject body;
  a plurality of flow channels disposed in the inject body, the plurality of flow channels coupled to the first gas inlet; and
  an inject casing, the inject casing surrounding the inject assembly;
an inductive heater coupled to the inject assembly, the inductive heater configured to heat a gas, the inductive heater comprising:
  a heater housing;
  a graphite rod disposed in the heater housing, the graphite rod having a distal end and proximate end;
  an inductive coil disposed around the graphite rod; and
  a second gas inlet configured to flow a second gas between the heater housing and the graphite rod, the second gas inlet disposed at the distal end and fluidly connected to the plurality of flow channels of the inject assembly.

12. The apparatus of claim 11, wherein the inject casing comprises a flange configured to secure the inject assembly to a process chamber component.

13. The apparatus of claim 12, wherein the inject casing comprising a quartz material.

14. The apparatus of claim 11, wherein the inductive coil is coupled to a radio frequency (RF) power source configured to heat the graphite rod up to about 1200 degrees Celsius.

15. The apparatus of claim 11, wherein the heater housing includes cooling channels configured to flow heat transfer fluid therethrough.

16. The apparatus of claim 11, wherein the inject assembly further comprises an inject cap, the inject cap configured to support a transmissive window and a sensor.

17. The apparatus of claim 16, wherein the sensor is a pyrometer configured to measure a temperature of the graphite rod at the proximate end.

18. The apparatus of claim 16, further comprising a controller coupled to the sensor, the controller configured to adjust a radio frequency (RF) power source coupled to the inductive coil.

19. The apparatus of claim 11, wherein the inject assembly further comprises at least two plurality of flow channels stacked in a direction perpendicular to a direction of flow through the channels.

20. A process chamber system comprising:

a process chamber having a chamber volume therein;
a substrate support;
a pre-heat ring disposed in the chamber volume, the substrate support surrounding the pre-heat ring;
an inject assembly comprising:
  an inject body;
  a first gas inlet configured to flow a first gas through the inject body;
  a plurality of flow channels disposed in the inject body, the plurality of flow channels coupled to the first gas inlet; and
an inductive heater coupled to the inject assembly, the inductive heater configured to heat a gas, the inductive heater comprising:
  a heater housing;
  a graphite rod disposed in the heater housing, the graphite rod having a distal end and proximate end;
  an inductive coil disposed around the graphite rod; and
  a second gas inlet configured to flow a second gas between the heater housing and the graphite rod, the second gas inlet disposed at the distal end and fluidly connected to the plurality of flow channels of the inject assembly.

* * * * *